(12) United States Patent
Lee et al.

(10) Patent No.: US 6,979,633 B2
(45) Date of Patent: Dec. 27, 2005

(54) METHOD OF MANUFACTURING SEMICONDUCTOR DEVICE

(75) Inventors: Seok Kiu Lee, Kyoungki-do (KR); Il Wook Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 60 days.

(21) Appl. No.: 10/704,231

(22) Filed: Nov. 7, 2003

(65) Prior Publication Data

US 2004/0235282 A1    Nov. 25, 2004

(30) Foreign Application Priority Data

May 21, 2003  (KR) ...................... 10-2003-0032210

(51) Int. Cl.$^7$ ........................................... H01L 21/425
(52) U.S. Cl. ...................................................... 438/533
(58) Field of Search ............................... 438/622, 597, 438/586, 533, 694, 525; 326/44; 428/704

(56) References Cited

U.S. PATENT DOCUMENTS 5,963,826 A    10/1999  Takanabe et al.
6,242,331 B1    6/2001  Chu et al.

FOREIGN PATENT DOCUMENTS

| JP | 64 009641 | 1/1989 |
| JP | 9 148268 | 6/1997 |
| JP | 9148268 | * 6/1997 |

* cited by examiner

*Primary Examiner*—Carl Whitehead, Jr.
*Assistant Examiner*—Monica D. Harrison
(74) *Attorney, Agent, or Firm*—Ladas & Parry LLP

(57) ABSTRACT

Disclosed is a method of manufacturing a semiconductor device, which prevents a contact resistance due to a native oxide film from being increased. Semiconductor substrate on which a lower structure having a junction region is formed is prepared. Interlayer dielectric film is formed over a whole surface of semiconductor substrate. Contact hole exposing the junction region is formed by etching interlayer dielectric film. Dry-cleaning and wet-cleaning for a substrate surface exposed by the contact hole are sequentially performed. Washed contact surface is preliminarily treated under reducing gas atmosphere to remove a native oxide film formed on contact surface. Impurity is additionally doped to a surface of the junction region in-situ so that impurity damages on preliminary-treated contact surface are compensated for. Conductive film is deposited on the contact hole and the interlayer dielectric film in-situ.

6 Claims, 4 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and more particularly to a method of manufacturing a semiconductor device which prevents contact resistance due to a native oxide film from being increased.

2. Description of the Prior Art

As generally known in the art, in addition to the advancement of semiconductor techniques, development of high speed operation and high integration of semiconductor devices are in progress. Accordingly, fine adjustment and high integration of a pattern have been necessary. In accordance with such a tendency, various process techniques have been developed and used to obtain excellent device characteristics.

In particular, in order to improve the operation performance of semiconductor devices, new contact process techniques have been developed. In the contact process techniques, when a contact between upper and lower patterns is unstable or a contact resistance increases, although a fine adjustment of a pattern is achieved, the reliability of the semiconductor device is lacking and it is difficult to perform a high speed operation thereof.

Hereinafter, a conventional contact process will be briefly described.

FIGS. 1A through 1C are cross-sectional views which illustrate a conventional method of manufacturing a semiconductor device.

Referring to FIG. 1A, a silicon substrate 1 on which a predetermined lower structure having a junction region 2 is formed is prepared. An interlayer dielectric film 3 is deposited over a whole surface of the silicon substrate 1 to cover the lower structure. An etch mask, for example, a photoresist pattern 4 is formed on the interlayer dielectric film 3 by a known process. The photoresist pattern 4 defines a contact forming region.

Referring to FIG. 1B, the interlayer dielectric film 3 is etched by using the photoresist pattern 4. Consequently, a contact hole 5 exposing the junction region 2 is formed. The photoresist pattern 4 used as the etch mask is removed.

Referring to FIG. 1C, a conductive film, for example, a metal film is deposited on the interlayer dielectric film 3 so that the contact hole 5 is buried. The metal film is patterned to form a metal wiring 6 connected to the junction region 2 of the silicon substrate 1.

When forming the metal wiring 6, an intermediate plug material, namely, a polycrystalline silicon film 7 can be interposed between the metal wiring 6 and the junction region 2, as shown in FIG. 2. In FIG. 2, reference numeral 8 represents an oxide film.

Conventionally, when manufacturing the semiconductor device, etching residuals and a native oxide film of a substrate surface produced during a contact etching should be removed. In order to restore etching damage, after the contact hole is formed, plasma dry and wet cleaning processes are sequentially performed using $NF_3/O_2$, $SF_6/O_2$, $CF_4/O_2$, or $Ar/O_2$ and then a metal film is deposited.

However, during the formation of a contact conductive film, since the deposition of a metal film in sputtering equipment or the deposition of a polycrystalline silicon film in chemical vapor deposition equipment is achieved after the washed substrate surface is exposed to air, as shown in FIG. 3, the formation of a native oxide film 10 at a contact surface is unavoidable. Accordingly, an exact ohmic contact between the metal wiring 6 and the junction region 2 of the silicon substrate 1 is not achieved, thereby increasing contact resistance. This causes the semiconductor device to be degraded.

Also, so as to solve the above problems, conventionally, prior to depositing the metal film, a physical sputtering is performed with Argon plasma as an in-situ preliminary treatment. In order to minimize the formation of a native oxide film by means of polycrystalline silicon film deposition equipment, a substrate is loaded into a substrate loading portion, in a state that the substrate loading part is separately closed and an oxygen concentration is reduced less than 100 ppm by flowing nitrogen of high purity, a door positioned between the substrate loading portion and a high temperature deposition tube, and the substrate is loaded into the high temperature deposition tube.

However, such steps minimize the influence of the native oxide film and do not provide a clean contact surface, causing the increase of the contact resistance according to badness of the contact surface.

SUMMARY OF THE INVENTION

Accordingly, the present invention has been made to solve the above-mentioned problems occurring in the prior art, and an object of the present invention is to provide a method of manufacturing a semiconductor device, which prevents contact resistance due to a native oxide film from being increased.

In order to accomplish this object, there is provided a method of manufacturing a semiconductor device, comprising the steps of: i) preparing a semiconductor substrate on which a lower structure having a junction region is formed; ii) forming an interlayer dielectric film over a whole surface of the semiconductor substrate; iii) forming a contact hole exposing the junction region by etching the interlayer dielectric film; iv) sequentially dry-cleaning and wet-cleaning a surface of the semiconductor substrate exposed by the contact hole; v) preliminarily treating the washed contact surface under an atmosphere of a reducing gas to remove a native oxide film which is formed on the contact surface; vi) additionally in-situ doping an impurity to a surface of the junction region so that the impurity loss during preliminary treatment is compensated for and the impurity concentration on a surface of the junction region is increased; and vii) in-situ depositing a conductive film on the contact hole and the interlayer dielectric film.

Preferably, the reducing gas is a hydrogen gas or an ammonia gas. More preferably, step v) is performed by a low temperature plasma process or a high temperature heat treatment. Most preferably, the low temperature plasma process is performed to flow a hydrogen gas of 1 through 1000 sccm under a pressure of 1 through 300 Torr at a temperature of room temperature through 600° C. Also, the high temperature heat treatment is performed by flowing hydrogen gas of 1 through 5 slm under a pressure of 1 through 300 Torr at a temperature of 700 through 1000° C.

Furthermore, step vi) is performed by supplying gas molecules containing a damaged impurity into equipment and performing a low temperature plasma process or a high temperature heat treatment.

According to the present invention, after the contact hole is washed, sputtering or chemical vapor deposition equipment provides a reducing gas such as a hydrogen gas to a contact surface to remove a native oxide film formed on the contact surface. Furthermore, the impurity concentration on a surface of the junction region is increased by additional in-situ doping step. The equipment deposits a contact conductive film into the contact surface in-situ, so that a clean contact surface from which the native oxide film is removed is provided. Accordingly, a contact resistance due to the native oxide film from being efficiently prevented.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1A:
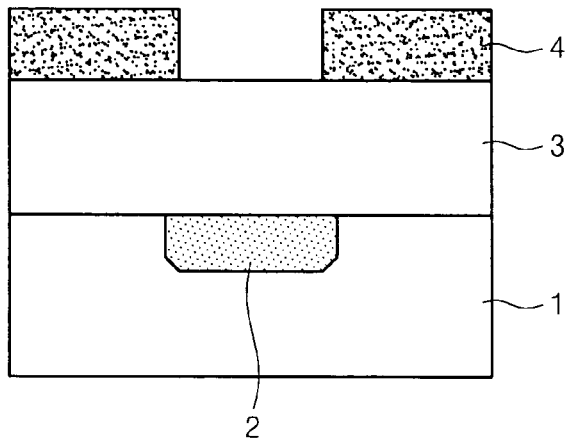
FIGS. 1A through 1C are cross-sectional views which illustrate a conventional method of manufacturing a semiconductor device.
Figure 1B:
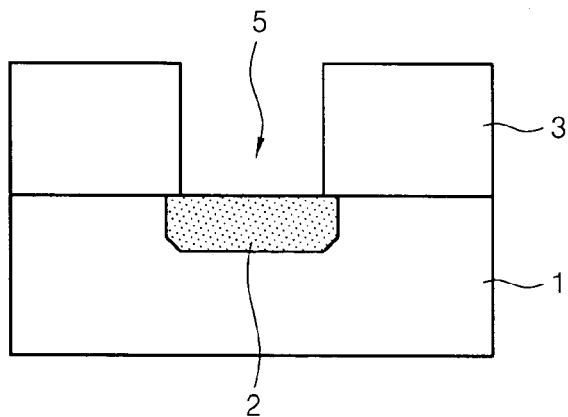
Figure 1C:
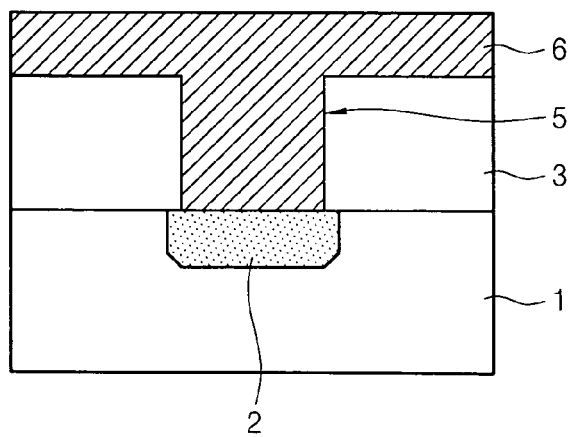
Figure 2:
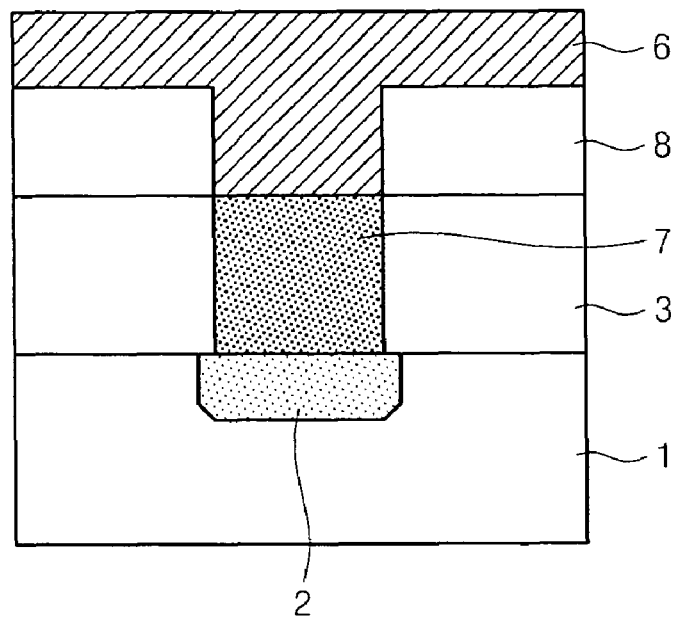
FIG. 2 is a cross-sectional view which illustrates a conventionally another method of manufacturing a semiconductor device.
Figure 3:
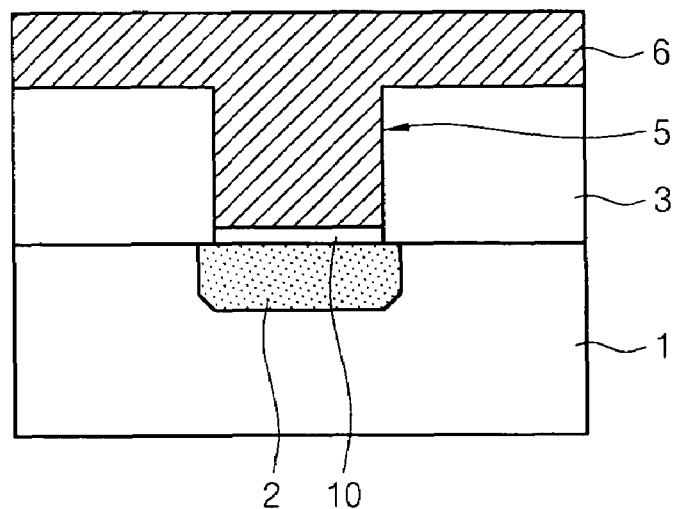
FIG. 3 is a cross-sectional view which illustrates problems of the conventional methods of manufacturing a semiconductor device.

Hereinafter, a preferred embodiment of the present invention will be described with reference to the accompanying drawings. In the following description and drawings, the same reference numerals are used to designate the same or similar components, and so repetition of the description on the same or similar components will be omitted.

FIGS. 4A through 4D are cross-sectional views which illustrate a method of manufacturing a semiconductor device according to an embodiment of the present invention.

Figure 4A:
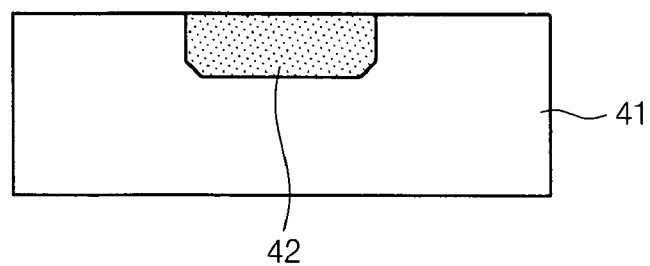
FIGS. 4A through 4D are cross-sectional views which illustrate a method of manufacturing a semiconductor device according to an embodiment of the present invention.

Referring to FIG. 4A, a silicon substrate 41 on which a predetermined lower structure having a junction region 42 is formed is prepared. In the junction region 42, a conductivity of a semiconductor is adjusted according to a kind of an impurity, an impurity concentration, and an impurity depth.

Figure 4B:
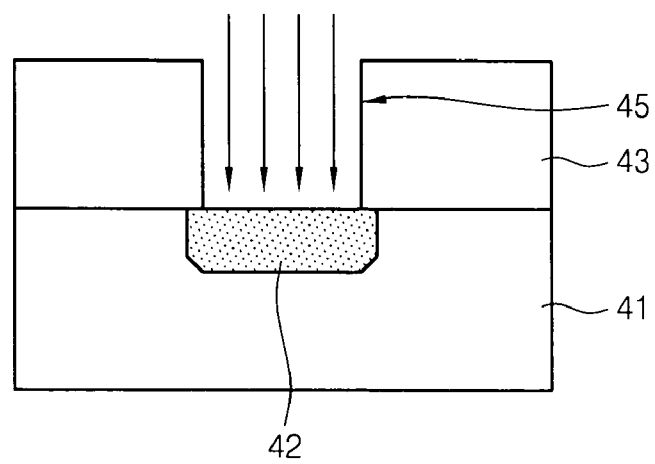

Referring to FIG. 4B, an interlayer dielectric film 43 is deposited over a whole surface of the silicon substrate 41 to cover the lower structure having the junction region 42. The interlayer dielectric film 43 is etched using a known process to form a contact hole 45 exposing the junction region 42.

In order to restore etching damages for a substrate contact surface such as etching residuals and a silicon lattice defect, a plasma dry cleaning process is performed using $NF_3/O_2$, $SF_6/O_2$, $CF_4/O_2$, or $A/O_2$ and then a wet cleaning process including an silicon dioxide film etching solution is performed.

In case of a silicon contact, a plasma dry cleaning removes the physical damages accumulated by a contact hole dry etching. After carbon system etching residuals are oxidized and removed, remaining oxide films are removed by a wet cleaning which uses a fluoride system chemical solution. Consequently, a clean contact surface is obtained.

Figure 4C:
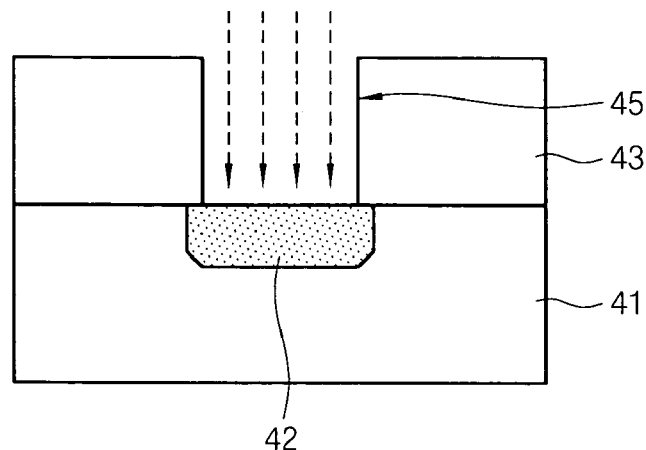

Referring to FIG. 4C, a substrate resulting object is loaded into sputtering equip or chemical vapor deposition equipment without delay. The sputtering equipment deposits a contact conductive film, namely, a metal film. The chemical vapor deposition equipment deposits a polycrystalline silicon film. In the process of loading the substrate resulting object into the sputtering equip or the chemical vapor deposition equipment, a native oxide film is produced on the contact surface. In an embodiment of the present invention, accordingly, in order to remove the native oxide film produced on the contact surface, after the substrate resulting object is loaded into the sputtering equipment or the chemical vapor deposition equipment, the contact surface is preliminarily treated under an atmosphere of a reducing gas. Preferably, in the embodiment of the present invention, the reducing gas includes a hydrogen gas or an ammonia gas.

The preliminary treatment includes a low temperature plasma process performed by flowing a hydrogen gas of 1 through 1000 sccm under a pressure of 1 through 300 Torr at a temperature in the range of room temperature through 600° C. The preliminary treatment includes a high temperature heat treatment performed by flowing a hydrogen gas of 1 through 5 slm under a pressure of 1 through 300 Torr at a temperature in the range of 700 through 1000° C. At this time, due to strong reductive feature of hydrogen, impurity of a substrate surface (namely, junction region 42) is combined with the hydrogen to form a hydride compound, and the hydride compound is discharged in a form of gas. Accordingly, the native oxide film formed on the contact surface is removed to obtain a clean contact surface. However, in case of a phosphorus (P) doped junction region, the hydrogen can also be combined with the phosphorus (P) and discharged in a form of $PH_3$ gas.

When the impurity of the junction region 42 is combined with the hydrogen and the hydrogen compound is discharged, a conductivity of the junction region 42 is deteriorated and a contact resistance thereof is increased. Accordingly, in the present invention, after performing the hydrogen preliminary treatment, a material containing a corresponding impurity is supplied into the equipment in-situ, and the low temperature plasma process or the high temperature heat treatment is performed to compensate for impurity damages in the junction region 42. In the case of a phosphorus (P) doped junction region, $PH_3$ gas of 10 through 1000 sccm is flowed and a plasma is generated under a pressure of 1 through 300 Torr at a temperature in the range of room temperature through 600° C., or $PH_3$ gas of 1 through 5 slm is flowed and a heat decomposition is performed under a pressure of 1 through 300 Torr at a temperature in the range of 700 through 1000° C. Then the phosphorus (P) is additionally doped into the contact surface.

Figure 4D:
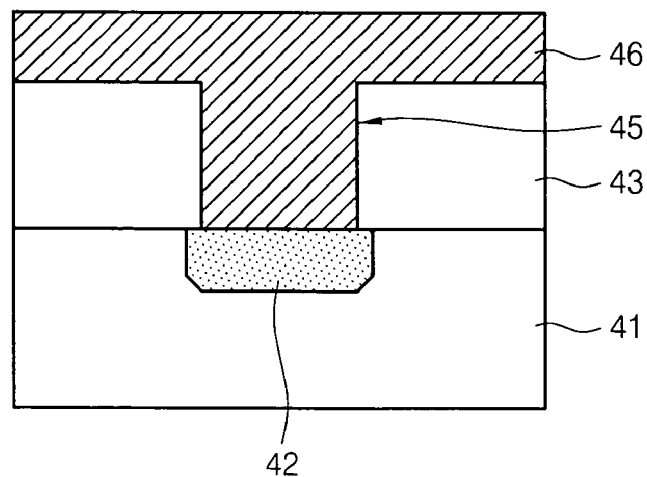

Referring to FIG. 4D, after performing the preliminary treatment for the contact surface, a metal film is deposited on the substrate resulting object in-situ so that the contact hole 45 is covered. The metal film is patterned to form a metal wiring 46 to be contacted with the junction region 42. Then, the known following processes are sequentially performed to obtain a semiconductor device according to the present invention.

The contact between the metal wiring 46 and the junction region 42 can also be achieved by interposing an intermediate plug material such as a polycrystalline silicon film between the metal wiring 46 and the junction region 42. A plug is formed by an etchback process or a chemical mechanical polishing (CMP). A contact hole is formed through a deposition and etching of an oxide film. Then, a metal wiring 46 to be contacted with the intermediate plug material is formed.

According to the present invention, since the preliminary treatment using a reducing gas such as hydrogen, an additional doping for compensating for damaged impurity, and a deposition of a contact conductive film are sequentially performed in an in-situ manner by means of the same equipment, the metal wiring is formed to have an ideal ohmic contact surface. Thus, in the semiconductor device manufactured by the method according to the present invention, the native oxide film is completely removed from the contact surface, causing reducing contact resistance.

In accordance with the present invention, after the contact hole is washed, sputtering or chemical vapor deposition equipment provides a reducing gas such as a hydrogen gas to a contact surface to remove a native oxide film formed on the contact surface. The equipment deposits a contact conductive film into the contact surface in-situ, so that a clean contact surface from which the native oxide film is removed is provided. Accordingly, it prevents efficiently a contact resistance due to the native oxide film from being increased. Since the present invention deposits the contact conductive film after compensating for the impurity damaged during the in-situ preliminary treatment, it prevents device feature from being deteriorated. Therefore, since the present invention forms an ideal ohmic contact, it improves device feature and manufacturing yield.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of manufacturing a semiconductor device, comprising the steps of:
    i) preparing a semiconductor substrate on which a lower structure having a junction region is formed;
    ii) forming an interlayer dielectric film over a whole surface of the semiconductor substrate;
    iii) forming a contact hole exposing the junction region by etching the interlayer dielectric film;
    iv) sequentially dry-cleaning and wet-cleaning a surface of the semiconductor substrate exposed by the contact hole, wherein any oxide layer formed on the junction region exposed by the contact hole is removed;
    v) preliminary treating the washed contact surface under an atmosphere of a reducing gas to remove a native oxide film which is formed on the contact surface due to air exposure;
    vi) additionally in-situ doping an impurity to a surface of the junction region so that impurity damages on the preliminary-treated contact surface are compensated for; and
    vii) in-situ depositing a conductive film on the contact hole and the interlayer dielectric film.

2. A method as claimed in claim 1, wherein the reducing gases include a hydrogen gas or an ammonia gas.

3. A method as claimed in claim 1, wherein step v) is performed by a low temperature plasma process or a high temperature heat treatment.

4. A method as claimed in claim 3, wherein the low temperature plasma process is performed to flow a hydrogen gas of 1 through 100 sccm under a pressure of 1 through 300 Torr at a temperature of room temperature through 600° C.

5. A method as claimed in claim 3, wherein the high temperature heat treatment is performed to flow a hydrogen gas of 1 through 5 slm under a pressure of 1 through 300 Torr at a temperature of 700 through 1000° C.

6. A method as claimed in claim 1, wherein step vi) is performed by supplying a material containing a damaged impurity into equipment and performing a low temperature plasma process or a high temperature heat treatment.

* * * * *